United States Patent
Lee et al.

(10) Patent No.: US 6,939,147 B2
(45) Date of Patent: Sep. 6, 2005

(54) JUNCTION BOX AND SOLDERING METHOD FOR PRINTED CIRCUIT BOARD OF THE JUNCTION BOX

(75) Inventors: Cheol Seob Lee, Daeku-Si (KR); Yang Youn Choi, Ansung-Si (KR); Jong Keun Song, Daeku-Si (KR)

(73) Assignee: Tyco Electronics AMP Korea Ltd., Kyungsangbuk-do (KR)

( * ) Notice: Subject to any disclaimer, the term of this patent is extended or adjusted under 35 U.S.C. 154(b) by 142 days.

(21) Appl. No.: 10/337,160

(22) Filed: Jan. 6, 2003

(65) Prior Publication Data

US 2004/0129765 A1 Jul. 8, 2004

(51) Int. Cl.$^7$ ............................ H01R 12/00; H01K 1/00
(52) U.S. Cl. ...................... 439/76.2; 439/512; 228/256
(58) Field of Search .............................. 228/256, 752; 361/775, 777; 439/76.2, 512

(56) References Cited

U.S. PATENT DOCUMENTS

| | | | | |
|---|---|---|---|---|
| 5,023,752 A | * | 6/1991 | Detter et al. ................ | 361/752 |
| 5,655,927 A | * | 8/1997 | Maue et al. ................ | 439/510 |
| 5,817,976 A | * | 10/1998 | Yanase et al. ............. | 174/52.1 |
| 6,547,572 B1 | * | 4/2003 | Burdick ..................... | 439/76.2 |
| 6,780,026 B2 | * | 8/2004 | Sato .......................... | 439/76.2 |
| 2004/0043647 A1 | * | 3/2004 | Takeuchi ................... | 439/76.2 |

* cited by examiner

Primary Examiner—Lynne R. Edmondson
(74) Attorney, Agent, or Firm—Barley Snyder LLC

(57) ABSTRACT

A printed circuit board junction box including an outer case and a printed circuit board. The outer case has a top cover and a bottom cover. The printed circuit board has female and male electrical terminals mounted in through-holes that extend from an upper surface to a lower surface of the printed circuit board. One side of the printed circuit board has only male electrical terminals. The printed circuit board is soldered by raising a molten solder container to contact the lower surface of the printed circuit board. The printed circuit board is turned in a heating chamber so that the molten solder flows through the through-holes in the printed circuit board to solder the female and male electrical terminals to the printed circuit board.

8 Claims, 6 Drawing Sheets

[FIG1]
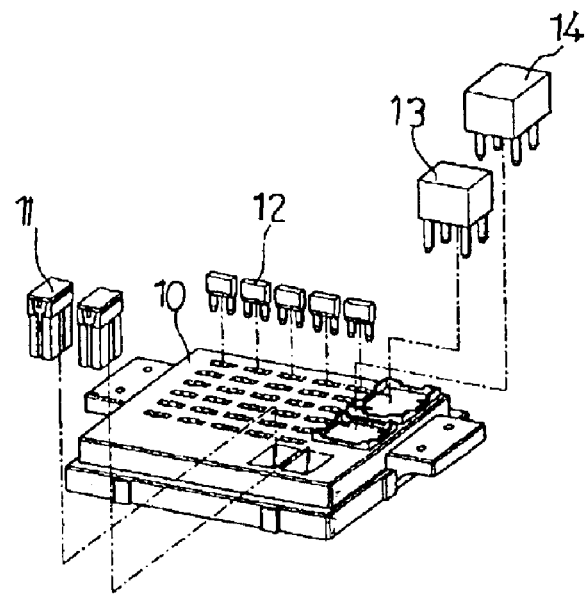
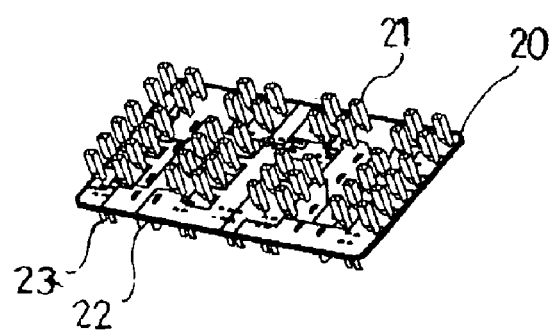
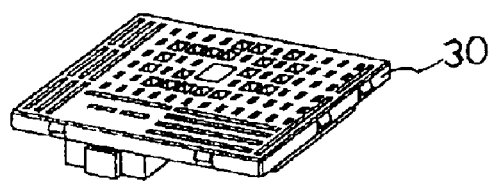
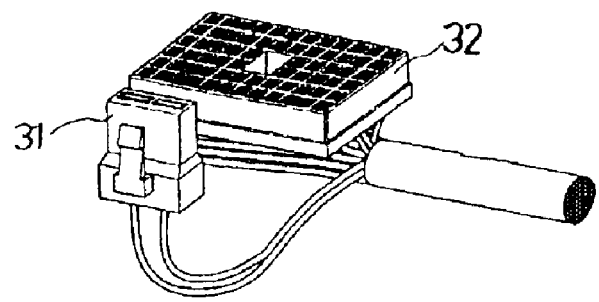

[FIG2]
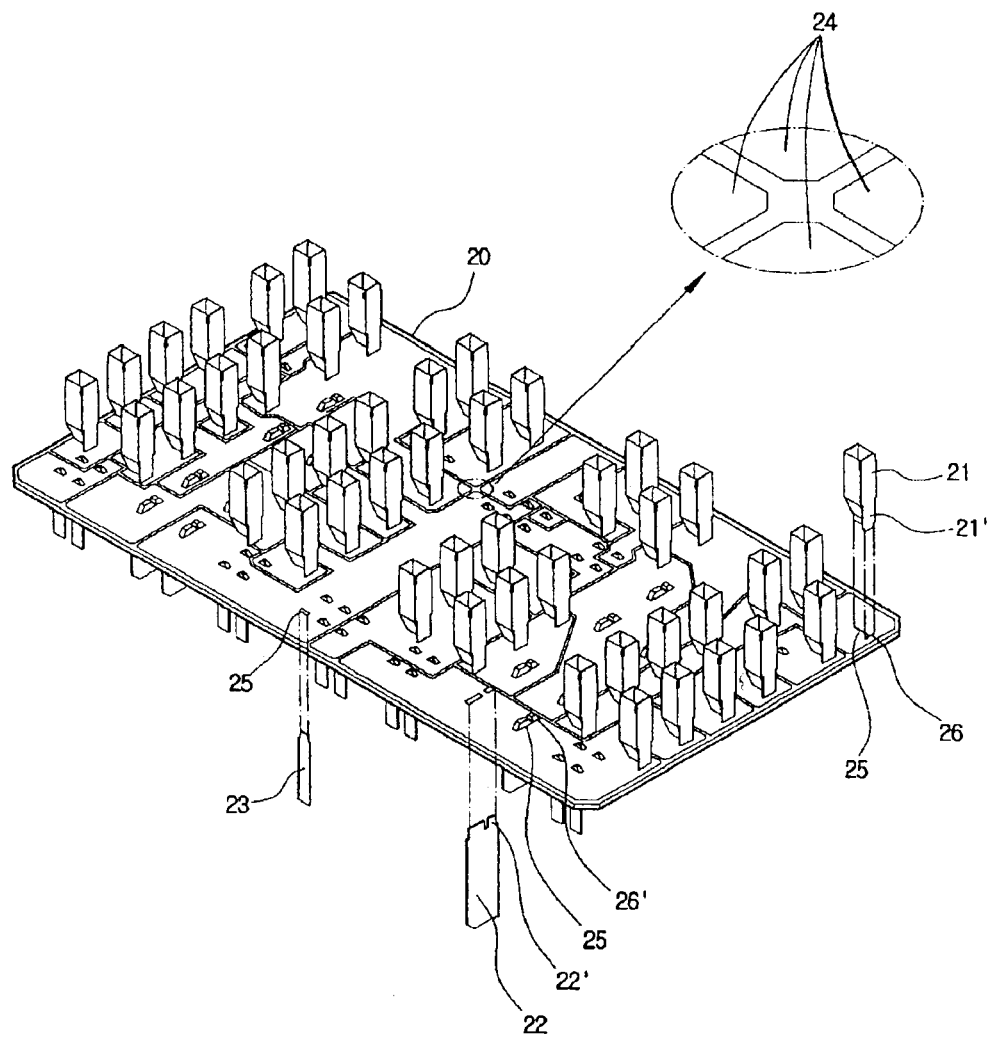

[FIG3]
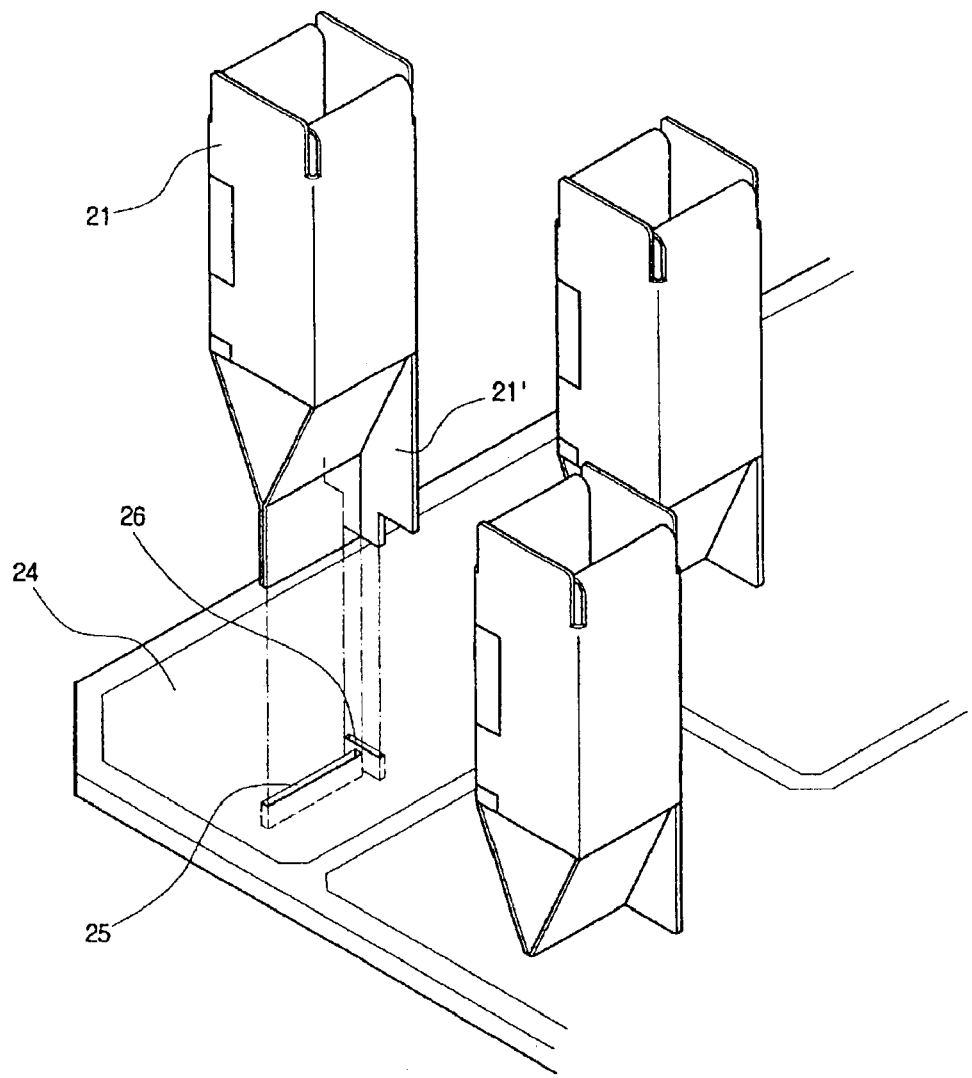

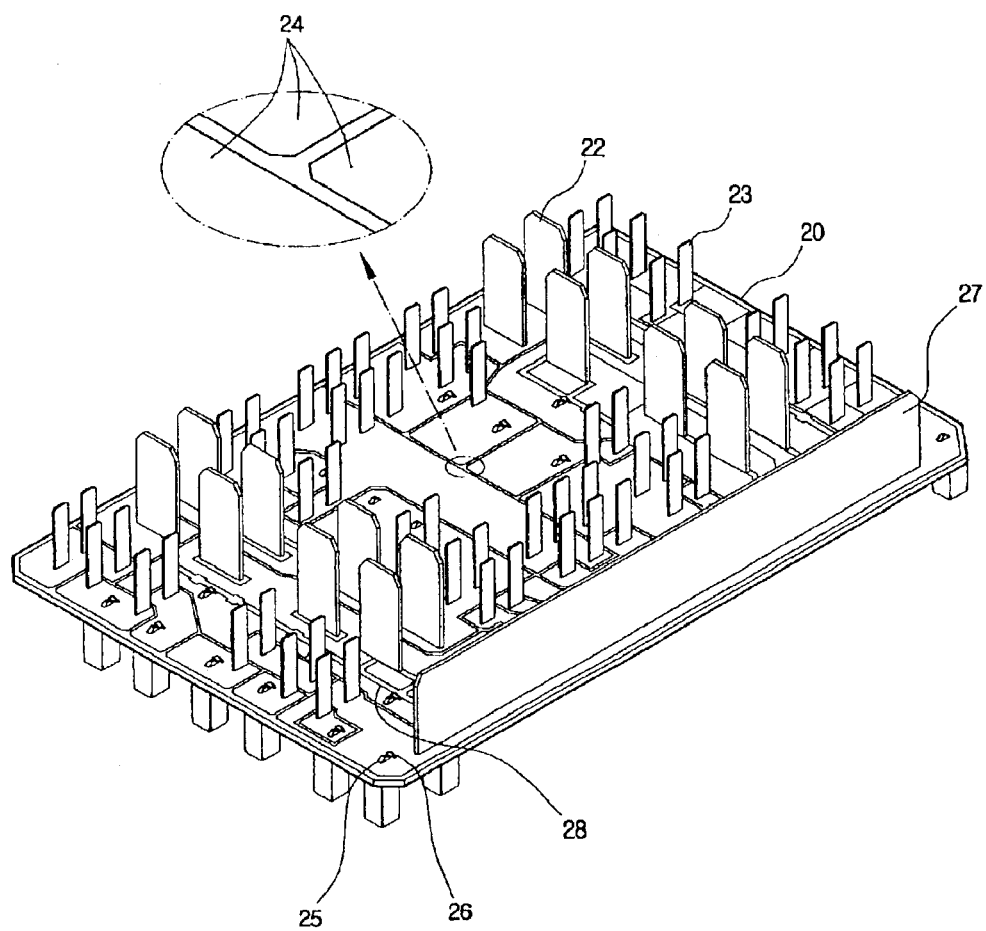
[FIG4]

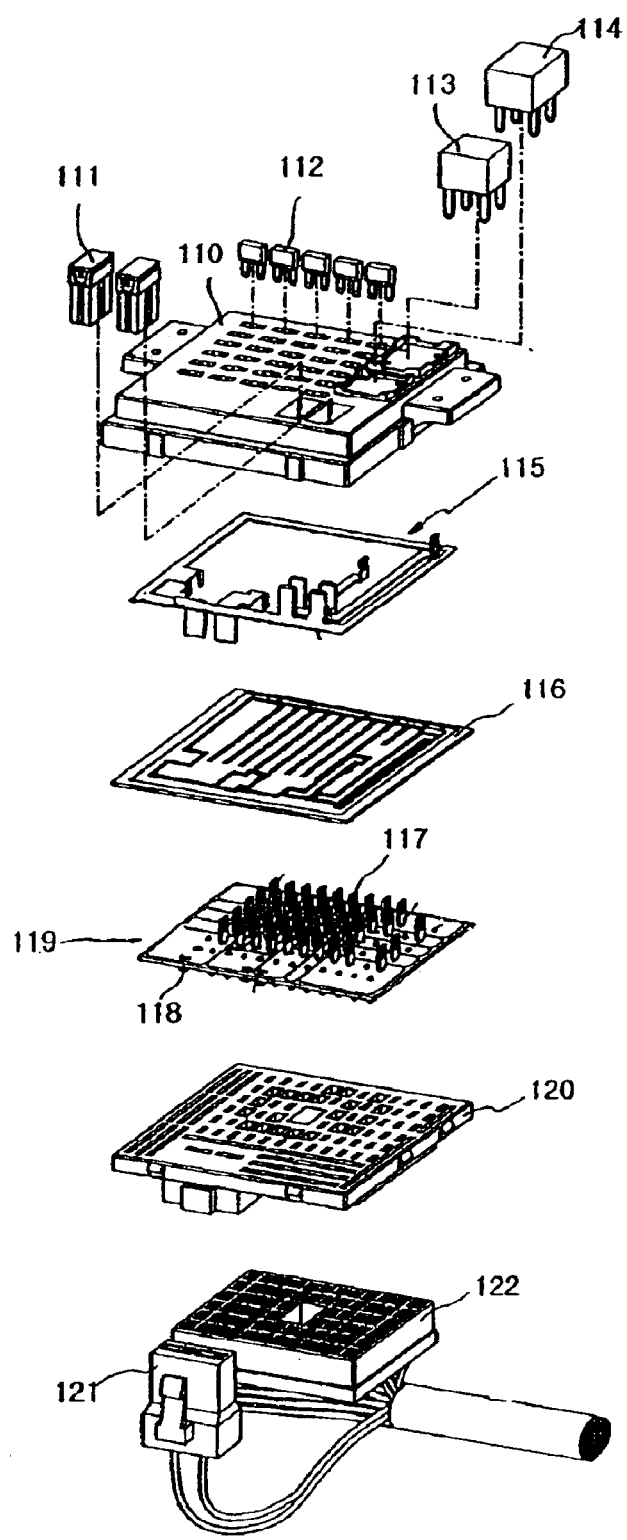
*Prior Art*
[FIG6]

JUNCTION BOX AND SOLDERING METHOD FOR PRINTED CIRCUIT BOARD OF THE JUNCTION BOX

BACKGROUND OF THE INVENTION

The invention relates to junction boxes and, more particularly, to an arrangement and method of soldering electrical terminals to a printed circuit board in a junction box.

DESCRIPTION OF THE PRIOR ART

In order to distribute electric power in accordance with different modes in a vehicle, junction boxes adapted to protect wiring in the vehicle are installed in a vehicle compartment and an engine compartment. Conventional junction boxes include a plurality of printed circuit boards (PCBs) vertically arranged in parallel. The PCBs are electrically connected by soldering connecting pins that are inserted into each PCB to each other along edges of the PCB. Because the conventional junction box uses a plurality of PCBs, the junction box takes up a lot of space in the vehicle. Further, because the connecting pins of the PCBs are soldered to each other in order to electrically connect the PCBs, the soldering process must be performed multiple times causing an increase in manufacturing time and cost.

In order to solve the above-mentioned problems, Korean Utility Model Publication No. 2000-0211471 teaches a junction box having a printed circuit board type structure. As shown in FIG. 6, the junction box includes an outer case having a top cover 110 and a bottom cover 120. The top cover 110 is configured to receive various devices, such as, fuses 111, 112 and relays 113, 114. The bottom cover 120 is configured to receive input and output connectors 121, 122. Disposed within the outer case is a metal bus layer 115, an insulating plate 116, and a single PCB 119. Electrical terminals 117, 118 are connected to the PCB 119. Each of the electrical terminals 118, which may be male electrical terminals, is fixed to a lower surface of the PCB 119 by means of soldering. Each of the electrical terminals 117, which may be male/female (MF) terminals, is mechanically inserted in an upper surface of the PCB 119. The electrical terminals 117, 118, therefore, can be installed on both surfaces of the PCB 119 at one time by soldering. However, it is impossible to solder the electrical terminals 117, 118 to the PCB 119 at one time with a wave soldering process using the waves of a liquid solder contained in a liquid solder container. The soldering of the electrical terminals 117, 118 may only be achieved using a more complex soldering process.

Since the MF terminals 117 are mechanically inserted in the PCB 119 at one surface of the PCB 119, the printed circuit board type junction box of the prior art may be broken down or may have unstable electrical connections due to an external impact applied thereto during use in the vehicle or when devices such as the relays 113, 114 or fuses 111, 112 are inserted or removed from the MF terminals 117. Further, it is necessary to use the insulating plate 116 in order to support the metal bus layer 115 while electrically isolating the metal bus layer 115 from the PCB 119 arranged beneath the metal bus layer 115. As a result, the entire structure and assembly process of the junction box is complicated and the size of the junction box is increased. Further, manufacturing costs are increased due to the additional cost incurred for the production and assembly of the insulating plate 116 and metal bus layer 115.

It is therefore desirable to develop a junction box having a printed circuit board for a simple and compact structure that dispenses with the metal bus layer and insulating plate required in conventional structures. It is also desirable to develop a junction box having a printed circuit board structure where electrical terminals can be mounted on the PCB using one step and are easily and simply soldered to the PCB while exhibiting an improvement in durability and impact resistance. It is further desirable to provide a junction box having a printed circuit board structure where electrical terminals mounted to an upper and lower surface of the PCB are reliably electrically connected and exhibit a high conductivity.

SUMMARY OF THE INVENTION

The invention relates to a printed circuit board junction box. The printed circuit board junction box includes an outer case and a printed circuit board. The outer case has a top cover and a bottom cover. The printed circuit board has female and male electrical terminals fitted in through-holes that extend from an upper surface to a lower surface of the printed circuit board, wherein one side of the printed circuit board has only male electrical terminals.

The invention further relates to a method for soldering a printed circuit board of a junction box. Female and male electrical terminals are mounted in through-holes on an upper and lower surface of a printed circuit board. Molten solder is applied to the lower surface of the printed circuit board. The printed circuit board is turned in a heating chamber so that the molten solder flows through the through-holes in the printed circuit board to solder the female and male electrical terminals to the printed circuit board.

BRIEF DESCRIPTION OF THE DRAWINGS

FIG. 1 is an exploded perspective view of a junction box;

FIG. 2 is a perspective view of an upper surface of a printed circuit board (PCB) of the junction box;

FIG. 3 is an enlarged perspective view of female electrical terminals inserted in the PCB of FIG. 2;

FIG. 4 is a perspective view of a lower surface of the PCB of FIG. 2;

FIG. 6 is an exploded perspective view of a conventional junction box.

DETAILED DESCRIPTION OF THE PREFERRED EMBODIMENT

Figure 5:
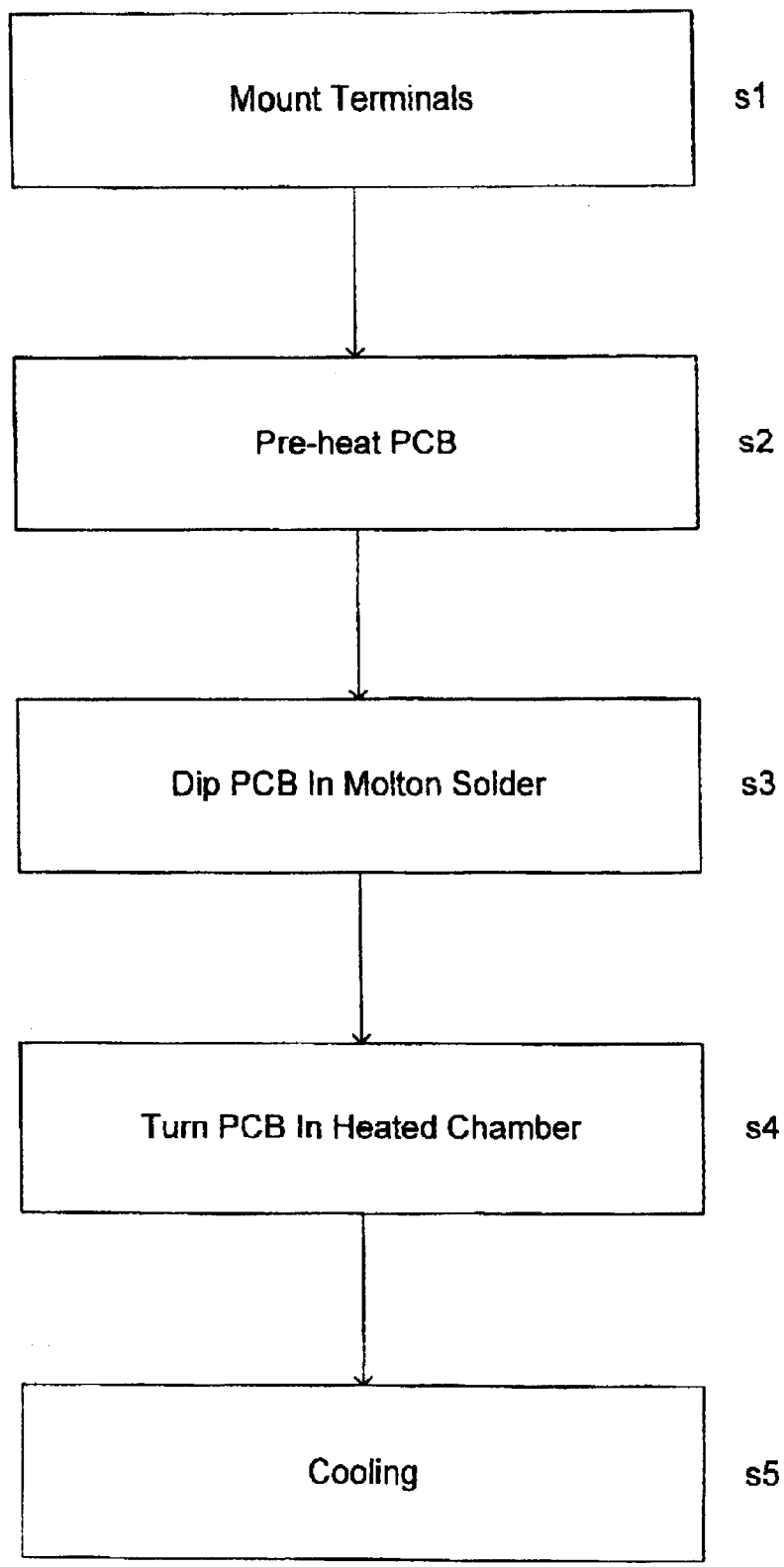
FIG. 5 is a flow chart showing a method for soldering the PCB of FIG. 2.

FIG. 1 shows a junction box according to the present invention. As shown in FIG. 1, the junction box has an outer case including a top cover 10 and a bottom cover 30 and a printed circuit board (PCB) 20. The top cover 10 has mounting holes for mounting devices, such as, fuses 11, 12 and relays 13, 14. The PCB 20 is mounted with a plurality of female electrical terminals 21 and male electrical terminals 22, 23. The bottom cover 30 is adapted to support the PCB 20 and is provided with input and output connectors 31, 32. Since the top cover 10 and the bottom cover 30 are well known in the art, no further description thereof will be given.

The PCB 20 and the female and male electrical terminals 21, 22, 23 will now be described in greater detail. As shown in FIGS. 2 and 4, the PCB 20 has wiring patterns 24 coated on an upper and lower surface of the PCB 20. The wiring patterns 24 are distributed over the entire surface of the PCB 20 and are separated by minimum-size gaps that insulate adjacent wiring patterns 24 and provide mechanical mounting areas. Each wiring pattern 24 is formed to have a large width so that the female and male electrical terminals 21, 22, 23 have optimal conductivity when connected to the PCB 20.

Through-holes 25 adapted to receive the female and male electrical terminals 21, 22, 23 extend through the PCB 20 from the upper surface to the lower surface. The female and male electrical terminals 21, 22, 23 are received in the through-holes 25 so that a portion of the female and male electrical terminals 21, 22, 23 slightly projects from an opposing surface of the PCB 20. Each through-hole 25 is configured so that a molten solder applied to one surface of the PCB 20 flows through the through-hole 25 to the opposing surface of the PCB 20 when the female and male electrical terminals 21, 22, 23 are fitted in the through-holes 25 to allow the female and male electrical terminals 21, 22, 23 to be soldered at the projected portion.

As shown in FIGS. 3 and 4, auxiliary through-holes 26, 26' may be formed near each of the through-holes 25. The auxiliary through-holes 26, 26' reduce electrical connection errors caused by contact errors generated during fitting and soldering the female and male electrical terminals 21, 22 to the PCB 20. The auxiliary through-holes 26, 26' also reduce electrical connection errors caused by contact errors generated between the PCB 20 and the female and male electrical terminals 21, 22 due to an external impact applied to the junction box during use of the junction box in a vehicle. The auxiliary through-holes 26, 26' can reliably maintain desired electrical connections even if the mechanical connection between the PCB 20 and the female electrical terminals 21 becomes unstable when various devices such as the fuses 11, 12 or relays 13, 14 are mounted to the female electrical terminals 21.

As shown in FIGS. 2 and 3, the female and male electrical terminals 21, 22 have auxiliary connection portions 21', 22', respectively. The auxiliary connection portions 21', 22' are inserted into the auxiliary through-holes 26, 26', respectively, so that the female and male electrical terminals 21, 22 are firmly supported by the PCB 20. The auxiliary connection portions 21', 22 increase the contact area of each connecting terminal 21, 22 on the PCB 20 to provide an effective electrical connection.

As shown in FIG. 4, auxiliary metal patterns on the wiring patterns 24 may be formed on a lower surface of the PCB 20. The auxiliary metal patterns may comprise metal traces 28 and a metal bus bar 27. Each of the metal traces 28 corresponds to an area along which an additional pattern formed along a part of each pattern on the PCB 20 is subjected to a soldering process. The metal bus bar 27 is mounted to the PCB 20 at one end of the PCB 20. The metal bus bar 27 may be fixed to the PCB 20 in an upright position by means of soldering so that an increased number of the female and male electrical terminals 21, 22, 23 may be mounted to the PCB 20. The metal bus bar 27 and metal traces 28 allow current to flow smoothly through the female and male electrical terminals 21, 22, 23, which require a large amount of current.

A method for soldering the female and male electrical terminals 21, 22, 23 to the PCB 20 of the junction box will now be described in greater detail with reference to the flow chart shown in FIG. 5. As shown at s1, the female and male electrical terminals 21, 22, 23 are mounted to the PCB 20. The female electrical terminals 21 are mounted on the upper surface of the PCB 20 by inserting the female electrical terminals 21 into the through-holes 25. The male electrical terminals 21, 22 are mounted on the lower surface of the PCB 20 by inserting the male electrical terminals 22, 23 into the through-holes 25. It is preferable that only the male electrical terminals 22, 23 are mounted to the lower surface of the PCB 20.

As shown at s2, the PCB 20 is pre-heated. The PCB 20 is preheated so that the PCB 20 is protected during the soldering process and achieves optimal soldering results. As shown at s3, the pre-heated PCB 20 is dipped into a molten solder container so that the lower surface of the PCB 20 on which the male electrical terminals 22, 23 are exposed contacts the molten solder. Unlike the conventional method where the PCB 20 would be dipped into the molten liquid container by moving the PCB 20 downward into the molten liquid container, the PCB 20 is fixed and the molten liquid container is moved upward so that the molten solder is applied to the lower surface of the PCB 20 and moved downward after the completion of the soldering process. At step s3, the molten solder is applied to each portion of the female electrical terminals 21 that projects from the lower surface of the PCB 20 through the associated through-hole 26.

Since the soldering process is carried out in this fashion, it is possible to effectively turn over the PCB 20 after completion of the soldering process, as shown at s4. The soldered PCB 20 is turned over in a heating chamber. When the soldered PCB 20 is turned over, the molten solder applied to each of the male electrical terminals 22, 23 flows to the portion of the male electrical terminals 22, 23 that projects from the upper surface of the PCB 20 via the associated through-holes 26' to solder the projected portion.

As shown at s5, the heated PCB 20 is then cooled and tested. By preventing an abrupt temperature change of the PCB 20, the solder applied to the PCB 20 is prevented from accumulating on the male electrical terminals 22, 23. Accordingly, it is possible to reliably fix each of the female and male electrical terminals 21, 22, 23 inserted into the PCB 20 by a single soldering process.

The junction box of the present invention has a simple structure comprising the metal bus bar 27 and the metal traces 28 in place of a metal bus layer 115 and insulating plate 116 as required in the conventional structure shown in FIG. 6. Accordingly, it is possible to simplify the structure of the junction box while reducing the number of elements, thereby reducing the manufacturing cost. Auxiliary through-holes 26, 26' are formed on the PCB 20 near each of the through-holes 25 to ensure a reliable and easy electrical connection. The PCB 20 carries, at one surface thereof, only the male electrical terminals 22, 23. This configuration enables the female and male electrical terminals 21, 22, 23 to be fixed on the upper and lower surfaces of the PCB 20 using a single soldering process. As a result, manufacturing time and cost may be reduced.

The foregoing illustrates some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range of equivalents.

What is claimed is:

1. A printed circuit board junction box comprising:
    an outer case having a top cover and a bottom cover;
    a printed circuit board having female and male electrical terminals mounted in through-holes that extend from an upper surface to a lower surface of the printed circuit board, the printed circuit board is coated with a wiring pattern and a soldered auxiliary metal pattern that allows current to flow through the female and male electrical terminals; and
    a plurality of the female and male electrical terminals have auxiliary connection portions that are received in auxiliary through-holes in the printed circuit board.

2. The printed circuit board junction box of claim 1, wherein the auxiliary metal pattern includes reinforced metal traces and a bus bar.

3. The printed circuit board junction box of claim 2, wherein the bus bar is fixed to an end of the printed circuit board in an upright position.

4. The printed circuit board junction box of claim 1, wherein the auxiliary metal pattern is formed on the lower surface of the printed circuit board.

5. The printed circuit board junction box of claim 1, wherein only male electrical terminals are mounted on the lower surface of the printed circuit board.

6. The printed circuit board junction box of claim 1, wherein the female and male electrical terminals are received in the printed circuit board such that a portion of the female and male electrical terminals projects from an opposing surface of the printed circuit board.

7. The printed circuit board junction box of claim 1, wherein the through-holes are configured so that when the female and male electrical terminals are fitted in the through-holes a molten solder applied to a surface of the printed circuit board flows through the through-holes to an opposing surface of the printed circuit board.

8. The printed circuit board junction box of claim 1, wherein the auxiliary through-holes extend from the upper surface to the lower surface of the printed circuit board.

* * * * *